United States Patent
Keshavarzi et al.

(10) Patent No.: US 7,001,811 B2
(45) Date of Patent: Feb. 21, 2006

(54) METHOD FOR MAKING MEMORY CELL WITHOUT HALO IMPLANT

(75) Inventors: Ali Keshavarzi, Portland, OR (US); Stephen H. Tang, Beaverton, OR (US); Dinesh Somasekhar, Portland, OR (US); Fabrice Paillet, Hillsboro, OR (US); Muhammad M. Khellah, Lake Oswego, OR (US); Yibin Ye, Portland, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/750,566

(22) Filed: Dec. 31, 2003

(65) Prior Publication Data

US 2005/0145935 A1    Jul. 7, 2005

(51) Int. Cl.
*H01L 21/336* (2006.01)
(52) U.S. Cl. ...................... 438/270; 438/705
(58) Field of Classification Search ............... 438/270, 438/705, 723, 743
See application file for complete search history.

(56) References Cited

U.S. PATENT DOCUMENTS 6,255,219 B1 *   7/2001   Xiang et al. ................. 438/705

OTHER PUBLICATIONS

Ohsawa, Takashi et al., Memory Design Using a One-Transistor Gain Cell on SOI, IEEE Journal of Solid-State Circuits, vol. 37, No. 11, Nov. 2002, ISSN: 0018-9200, pp. 1510-1522.

Thompson, Scott, et al., "MOS Scaling: Transistor Challenges for the 21$^{st}$ Century", Intel Technology Journal Q3'98. 19pgs.

Ohsawa, Takashi et al., "ISSCC 2002/Session 9/Dram and Ferroelectric Memories / 9.1", Memory LSI Research and Development Center, Yokohama, Japan. 3pgs.

Brand, A., "Intel's 0.25 Micron, 2.0Volts Logic Process Technology", Intel Technology Journal Q3'98. 9pgs.

* cited by examiner

*Primary Examiner*—David Nelms
*Assistant Examiner*—Thinh T Nguyen
(74) *Attorney, Agent, or Firm*—Buckley, Maschoff & Talwalker LLC

(57) ABSTRACT

Some embodiments provide a memory cell comprising a body region doped with charge carriers of a first type, a source region disposed in the body region and doped with charge carriers of a second type, and a drain region disposed in the body region and doped with charge carriers of the second type. According to some embodiments, the body region, the source region, and the drain region are oriented in a first direction, the body region and the source region form a first junction, and the body region and the drain region form a second junction. Moreover, a conductivity of the first junction from the body region to the source region in a case that the first junction is unbiased is substantially less than a conductivity of the second junction from the body region to the drain region in a case that the second junction is unbiased. Some embodiments further include a transistor oriented in a second direction, wherein the second direction is not parallel to the first direction.

6 Claims, 7 Drawing Sheets

METHOD FOR MAKING MEMORY CELL WITHOUT HALO IMPLANT

BACKGROUND

Conventional electronic memories may be implemented by arrays of discrete memory cells. Many types of memory cells and many systems for writing a value to and reading a value from a memory cell currently exist.

FIG. 1 shows a cross-sectional view of floating-body dynamic random access memory (FBDRAM) memory cell 1. Cell 1 comprises a single transistor and is known as a gain cell because a value may be stored within and read from the transistor. The transistor is fabricated upon oxide 2 in a silicon-on-insulator (SOI) arrangement. The transistor includes n-type source region 3, p-type body region 4 and n-type drain region 5. Oxide 6 is disposed over gate region 4 and conductive element 7 overlays oxide 6.

A value is stored and read by manipulating charge carriers within body region 4. To improve charge retention, body region 4 may be isolated from adjacent memory cells by oxide 6, by the pn junctions between itself, source region 3 and drain region 5, and by shallow trench isolation in front of and behind the plane of FIG. 1. SOI process technology may, however, be undesirable in some instances.

DETAILED DESCRIPTION

Figure 1:
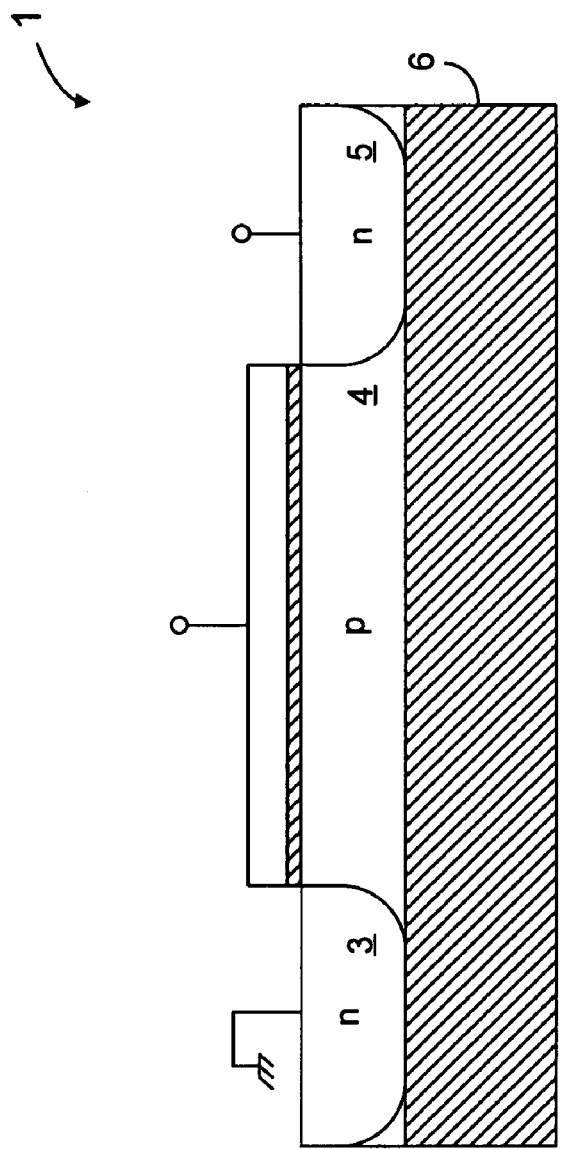
FIG. 1 is a cross-sectional view of an FBDRAM memory cell.
Figure 2:
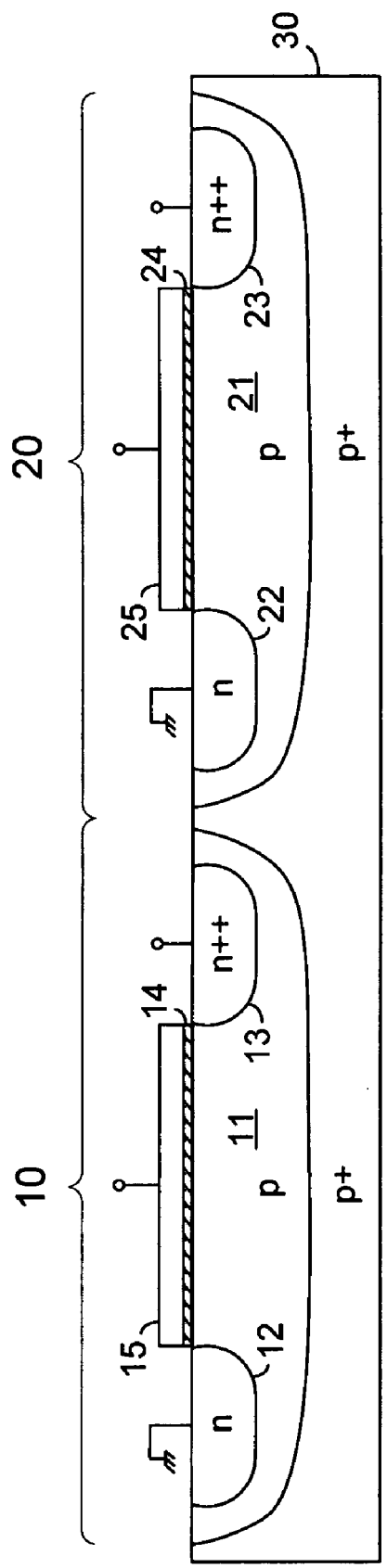
FIG. 2 is a cross-sectional view of memory cells according to some embodiments.

FIG. 2 is a cross-sectional side view of two memory cells according to some embodiments. Memory cells 10 and 20 are disposed adjacent to one another within substrate 30. Substrate 30 may comprise any currently- or hereafter-known semiconductor substrate, including but not limited to silicon. As indicated by FIG. 2, substrate 30 is doped so as to include an excess of p-type charge carriers, or holes. Doping methods and materials used for each doped structure described herein may comply with any currently- or hereafter-known suitable methods and materials. Moreover, memory cells 10 and 20 may be fabricated using any currently- or hereafter-known systems.

Memory cell 10 includes body region 11, which is doped with an excess of p-type charge carriers. The concentration of charge carriers in body region 11 is less than the concentration of charge carriers in substrate 30, as indicated by their respective "p" and "p+" designations. Source region 12 is disposed within body region 11, and is doped with an excess of n-type charge carriers. Drain region 13 is also disposed within body region 11 and is doped with an excess of n-type charge carriers. The concentration of charge carriers in source region 12 is less than the concentration of charge carriers in drain region 13, as indicated by their respective "n" and "n++" designations.

Body region 11 and source region 12 form a first pn junction at their interface. Similarly, body region 11 and drain region 13 form a second pn junction at their interface. In a case that both the first junction and the second junction are unbiased, a conductivity of the first junction from body region 11 to source region 12 is substantially less than a conductivity of the second junction from body region 11 to drain region 13. Such an arrangement may reduce leakage from body region 11 to source region 12, thus improving charge retention (i.e. the storage of a value) within body region 11. Such an arrangement may also facilitate the manipulation of charge (i.e., programmability of a value) within body region 11.

Gate oxide 14 is disposed over body region 11 and conductive element 15 is disposed thereon. Gate oxide 14 may comprise any suitable insulator, including but not limited to $SiO_2$, and conductive element 15 may comprise any conductor, including but not limited to polysilicon. Various layers of metallization and/or dielectric may be disposed above memory cell 10 according to some embodiments.

Memory cell 20 includes body region 21, source region 22, drain region 23, gate oxide 24, and conductive material 25, each of which may be substantially similar to their identically-named counterparts of memory cell 10. In some embodiments, body region 11 is separated from body region 21 by a shallow trench (not shown).

Figure 3A:
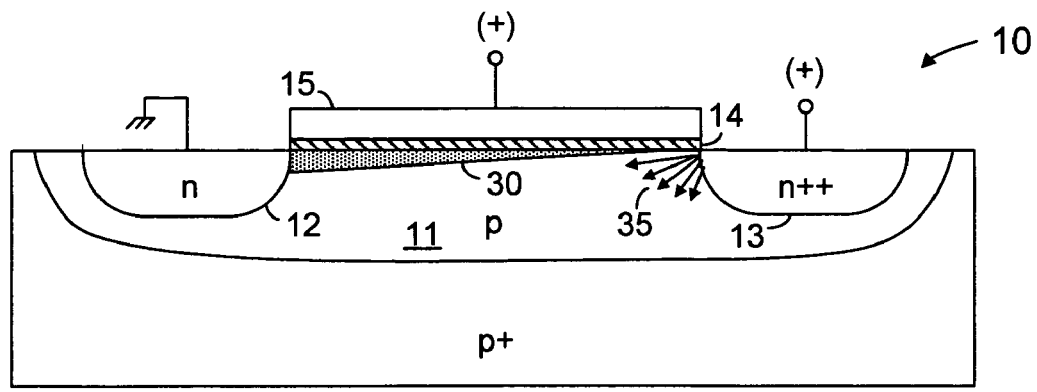
FIG. 3A is a cross-sectional view of a memory cell illustrating a write operation according to some embodiments.
Figure 3B:
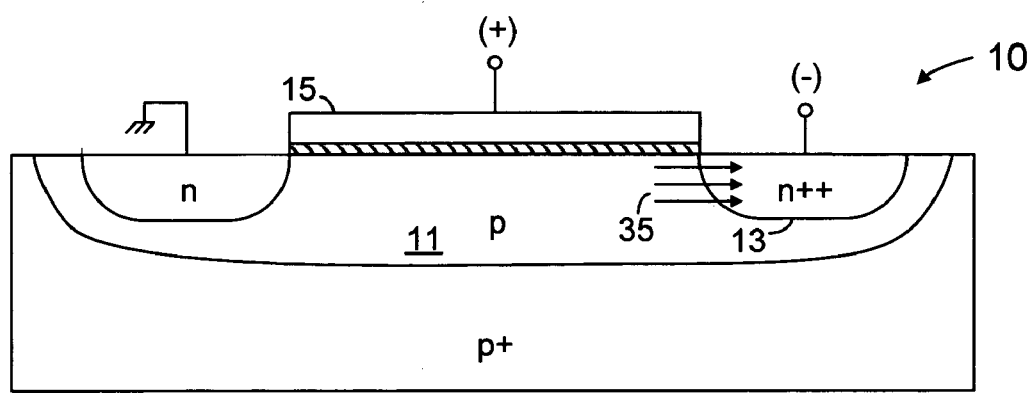
FIG. 3B is a cross-sectional view of a memory cell illustrating a write operation according to some embodiments.
Figure 3C:
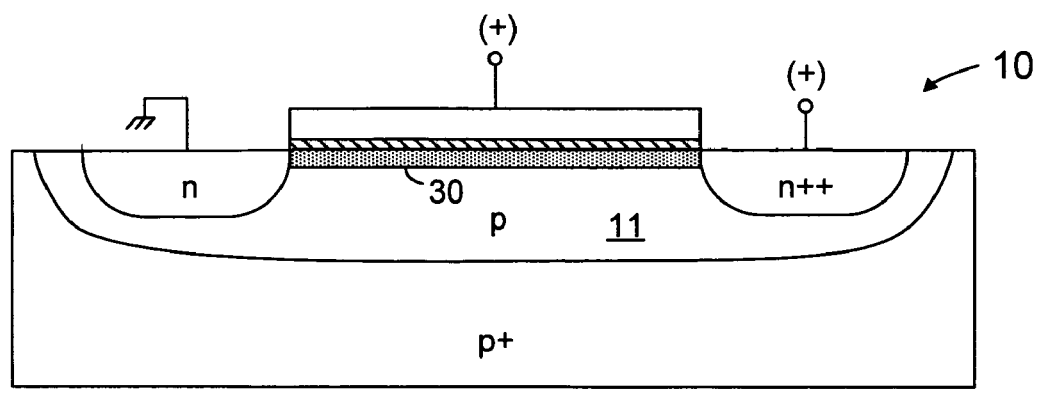
FIG. 3C is a cross-sectional view of a memory cell illustrating a read operation according to some embodiments.

FIGS. 3A through 3C illustrate the operation of memory cell 10 according to some embodiments. FIG. 3A illustrates an operation to write a value to memory cell 10. To write a value, memory cell 10 is operated in saturation to inject p-type charge carriers into body region 11 via impact ionization. In some embodiments, source region 12 is coupled to ground, conductive element 15 is coupled to a positive voltage, and drain region 13 is coupled to a positive voltage so as to cause memory cell 10 to operate in saturation.

FIG. 3A illustrates channel 30 that develops beneath gate oxide 14 during such operation. Charge carriers 35 are injected to body region 11 because channel 30 is "pinched off" at drain region 13. The injected charge carriers may represent a stored value of "1", but other stored values may be represented by the carriers depending on the chosen convention.

FIG. 3B illustrates an operation to write a value to memory cell 10 according to some embodiments. In this operation, a pn junction formed by body region 11 and drain region 13 is forward-biased to eject charge carriers 35 from body region 11. The junction may be forward-biased by applying a positive voltage to conductive element 15 and a negative voltage to drain region 13 since body region 11 is a p-type region and drain region 13 is an n-type region. After the operation, body region 11 may be considered to store a value of "0", but again, other conventions may be used.

FIG. 3C illustrates reading a value from memory cell 10 according to some embodiments. Channel 30 is shown to indicate that memory cell 10 is operating in a substantially linear operational region. Accordingly, memory cell 10 develops a drain current that is based at least in part on a concentration of charge carriers within body region 11. The concentration of charge carriers may therefore be determined based on the drain current. In some embodiments, the drain current is higher for a higher concentration of charge carriers (e.g., representing a stored "1" value), and lower for a lower concentration of charge carriers (e.g., representing a stored "0" value).

Figure 4:
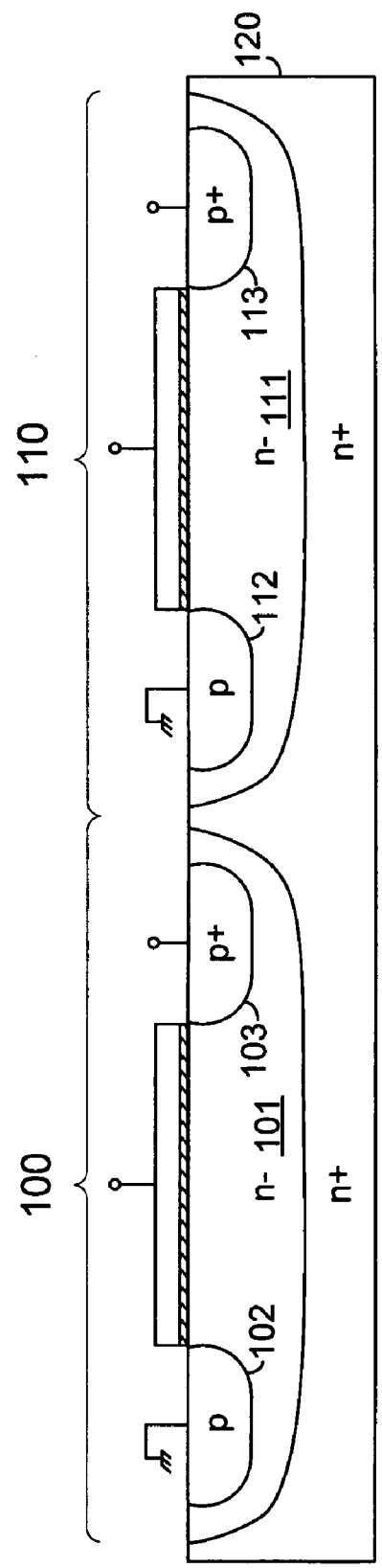
FIG. 4 is a cross-sectional view of memory cells according to some embodiments.

Memory cell configurations different from memory cell 10 and memory cell 20 may be used according to some embodiments. For example, FIG. 4 shows memory cells 100 and 110, each of which is implemented using a pnp transistor. Accordingly, substrate 120, body region 101, and body region 111 are doped with n-type charge carriers (i.e. electrons), and source regions 102, 112 and drain regions 103, 113 are doped with p-type charge carriers. Relative doping concentrations are indicated in FIG. 4, with substrate 120 ("n+") being more heavily doped than body regions 101, 111 ("n−"), and with drain regions 103, 113 ("p+") being more heavily doped than source regions 102, 112 ("p").

Similarly to memory cells 10 and 20, a conductivity of a first junction from body region 101 to source region 102 is substantially less than a conductivity of a second junction from body region 101 to drain region 103 in a case that both junctions are unbiased. Accordingly, some embodiments may be used in conjunction with any memory cell having a body region doped with charge carriers of a first type, a source region disposed in the body region and doped with charge carriers of a second type, and a drain region disposed in the body region and doped with charge carriers of the second type. Moreover, the body region and the source region form a first junction, the body region and the drain region form a second junction, and a conductivity of the first junction from the body region to the source region in a case that the first junction is unbiased is substantially less than a conductivity of the second junction from the body region to the drain region in a case that the second junction is unbiased.

Figure 5:
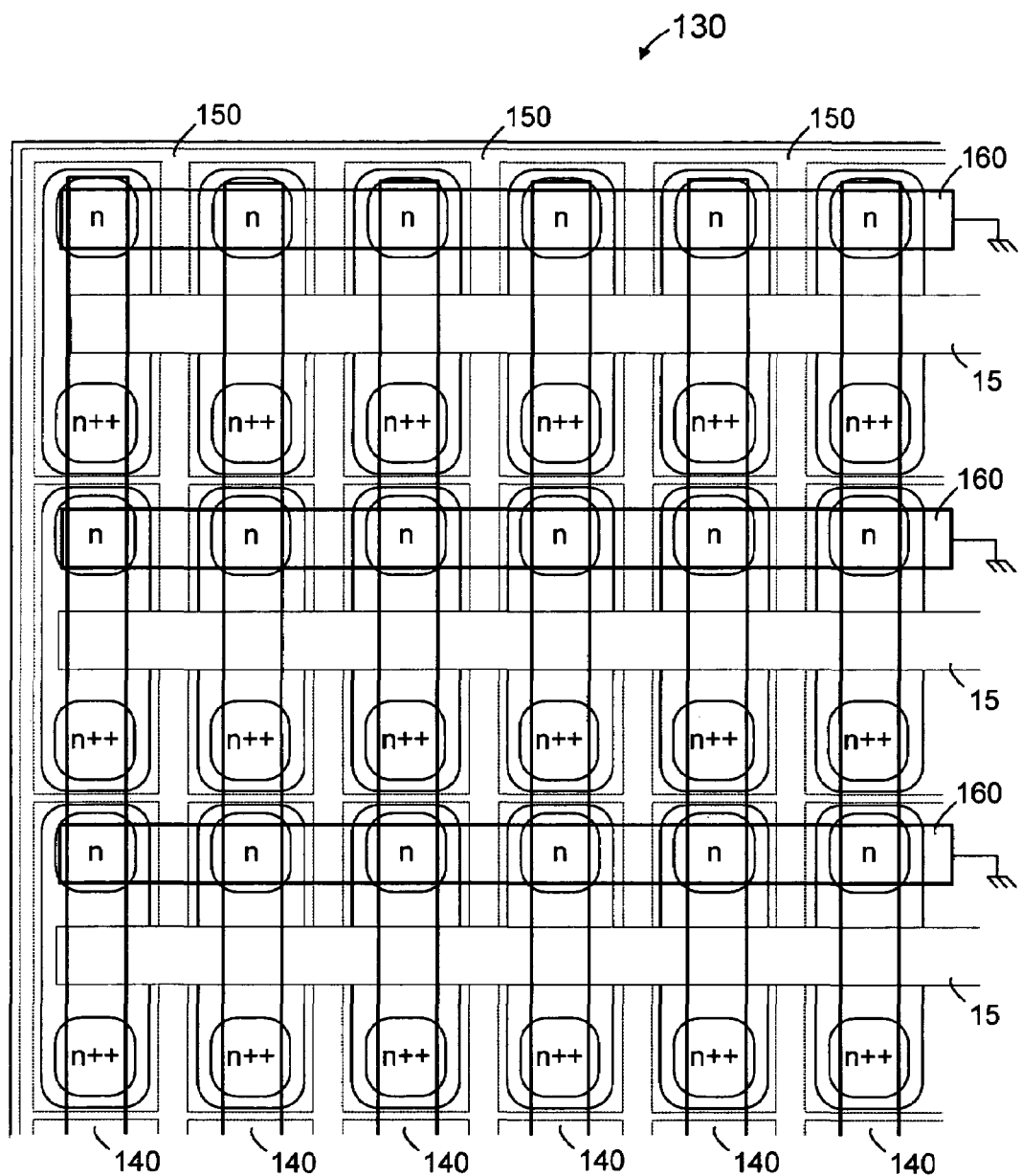
FIG. 5 is a top view of a memory cell array according to some embodiments.

FIG. 5 is a top view of a portion of memory cell array 130 according to some embodiments. Memory cell array 130 includes memory cells such as memory cells 10 and 20 disposed in a substrate such as substrate 30. The memory cells are oriented in a direction along signal lines 140. Trenches 150 separate each illustrated memory cell from each other memory cell. Such separation may improve charge retention within the body regions of the illustrated memory cells.

Signal lines 140 may be electrically coupled to the drain regions of each associated memory cell. In some embodiments, signal lines 140 comprise bit-lines for addressing and controlling an associated cell by applying a voltage to a drain region as described with respect to FIGS. 3A, 3B and 3C. In this regard, signal lines 160 may be coupled to the source regions of associated memory cells. As shown in FIGS. 3A, 3B and 3C, signal lines 160 may be coupled to ground.

FIG. 5 also shows conductive elements 15 according to some embodiments. Conductive elements 15 are coupled to a gate oxide that is disposed above a body region of an associated memory cell. Conductive elements 15 may therefore comprise word-lines for addressing and controlling an associated memory cell by applying a voltage to a gate of the memory cell as described with respect to FIGS. 3A, 3B and 3C. In the illustrated embodiment, conductive elements 15 are oriented in a direction substantially perpendicular to the orientation of the individual memory cells of array 130. Conductive elements 15 may prevent the fabrication of halo implants within one or more memory cells of memory array 130, as will be described in more detail below with respect to FIG. 6.

According to some embodiments, signal lines 140 are elevated so as to allow conductive elements 15 and signal lines 160 to pass between signal lines 140 and the substrate without contacting signal lines 140. Signal lines 140 may therefore be electrically coupled to respective drain regions by a via, pillar, or other suitable structure.

Figure 6:
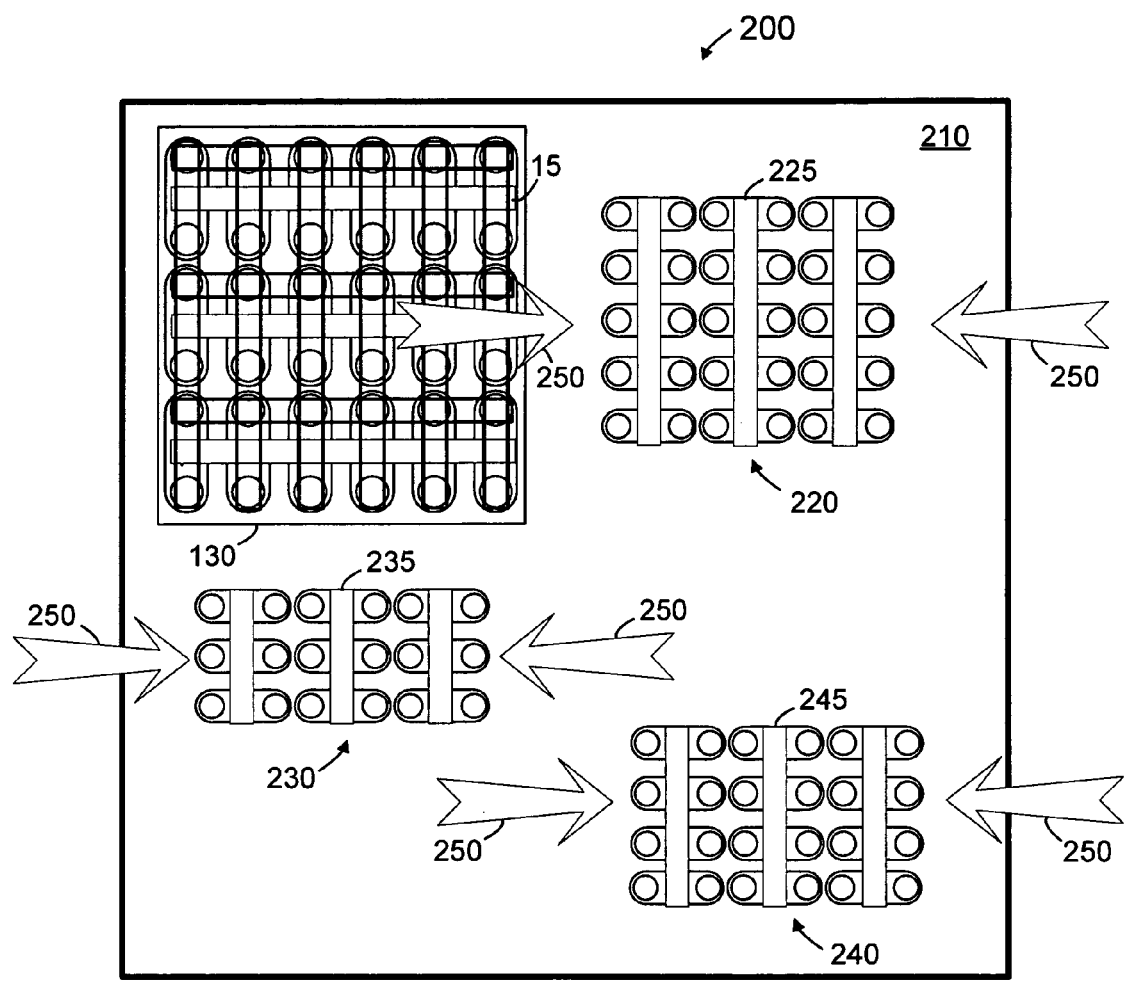
FIG. 6 is a representative top view of a device according to some embodiments.

FIG. 6 is a representative top view of device 200 according to some embodiments. Device 200 may comprise a microprocessor or any other device using memory cells and other transistor circuits.

Device 200 includes memory cell array 130 disposed in substrate 200. Also disposed in substrate 200 are transistor blocks 220, 230 and 240. Transistor blocks 220, 230 and 240 may be elements of one or more circuits that provide, separately or together, any functionality. The gate regions of each memory cell of transistor blocks 220, 230 and 240 are coupled to respective conductive elements 225, 235 and 245, which may be similar in composition and function to conductive elements 15 described above. At least one transistor of transistor blocks 220, 230 and 240 is oriented in a direction that is not parallel to the orientation of the memory cells of memory cell array 130. Accordingly, conductive elements 225, 235 and 245 may be perpendicular or otherwise disposed at an angle to conductive elements 15 of array 130. Such an arrangement may allow the fabrication of a halo implant within one or more transistors of transistor blocks 220, 230 and 240, and may prevent the fabrication of a halo implant within one or more memory cells of array 130.

Halo implants comprise elements that are heavily doped with the type of charge carriers that are in excess within a transistor's body region. Halo implants may reduce short channel effects during transistor operation. Halo implants may be fabricated within a transistor of device 200 after fabrication of body, source and drain regions of the transistor and of one or more memory cells of array 130. In some embodiments, halo implants are fabricated after conductive elements 15 are deposited on gate oxides of respective memory cells.

Arrows 250 show the direction of halo implantation according to some embodiments. The direction is substantially parallel to the orientation of conductive elements 15. Conductive elements 15 may therefore prevent the fabrication of a halo implant within an associated memory cell. In contrast, halo implants may be fabricated within one or more transistors of transistor blocks 220, 230, and 240 because respective conductive elements 225, 235, and 245 are not substantially parallel to the direction of halo implantation. In some embodiments, conductive elements 15 block the halo implants from implanting within memory cells of array 130, while conductive elements 225, 235, and 245 do not block the halo implants from implanting within memory cells of transistor blocks 220, 230, and 240.

According to some embodiments, device 200 is fabricated by fabricating a memory cell such as memory cell 10 having a body region, a source region, and a drain region oriented in a first direction, by fabricating a transistor oriented in a second direction, wherein the second direction is not parallel to the first direction, and by fabricating a halo implant within the transistor, wherein a halo implant is not fabricated in the memory cell. A conductive element may be fabricated over the body region of the memory cell, and may prevent fabrication of a halo implant in the memory cell. In some embodiments, a second memory cell such as memory cell 20, the second memory cell including a second body region oriented with the body region of the memory cell in a direction substantially perpendicular to the first direction. Some of the latter embodiments may also include fabricating a conductive element over the body region and the second body region and oriented in the direction.

The elements of device 200 are not necessarily shown to scale. According to some embodiments, the individually-illustrated transistors are much smaller with respect to device 200 than illustrated.

Figure 7:
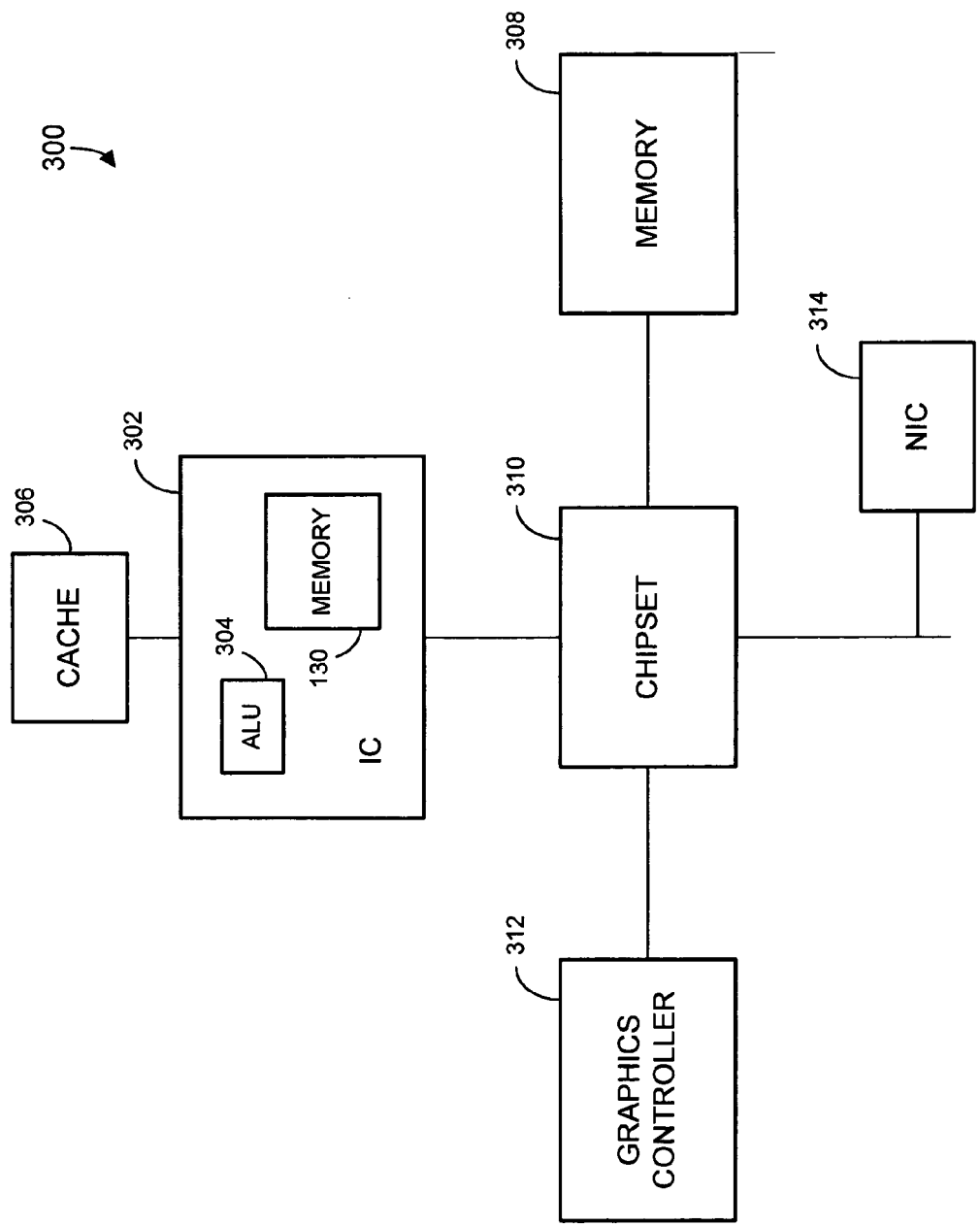
FIG. 7 is a block diagram of a system according to some embodiments.

FIG. 7 illustrates a block diagram of system 300 according to some embodiments. System 300 includes integrated circuit 302 comprising sub-blocks such as arithmetic logic unit (ALU) 304 and memory array 130, which serves as an on-die cache. Integrated circuit 302 may be a microprocessor or another type of integrated circuit. Integrated circuit 302 communicates with off-die cache 306 according to some embodiments. Off-die cache 306 may also comprise a memory such as memory 130. Integrated circuit 302 may communicate with system memory 308 via a host bus and chipset 310. System memory 308 may comprise any type of memory for storing data, such as a Single Data Rate Random Access Memory, a Double Data Rate Random Access Memory, or a Programmable Read Only Memory. Other off-die functional units, such as graphics controller 312 and Network Interface Controller (NIC) 314, may communicate with integrated circuit 302 via appropriate busses or ports.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A method comprising:
    fabricating a memory cell of a device, the memory cell comprising a body region doped with charge carriers of a first type, a source region disposed in the body region and doped with charge carriers of a second type, and a drain region disposed in the body region and doped with charge carriers of the second type, wherein the body region, the source region, and the drain region are oriented in a first direction, wherein the body region and the source region form a first junction, wherein the body region and the drain region form a second junction, and wherein a conductivity of the first junction from the body region to the source region in a case that the first junction is unbiased is substantially less than a conductivity of the second junction from the body region to the drain region in a case that the second junction is unbiased;
    fabricating a transistor of the device, the transistor oriented in a second direction, wherein the second direction is not parallel to the first direction; and
    fabricating a halo implant within the transistor,
    wherein a halo implant is not fabricated in the memory cell.

2. A method according to claim 1, further comprising:
    fabricating a conductive element disposed over the body region.

3. A method according to claim 2, the conductive element to prevent fabrication of a halo implant in the memory cell.

4. A method according to claim 1, further comprising:
    fabricating a second memory cell including a second body region, the second body region and the body region of the memory cell oriented in a direction substantially perpendicular to the first direction.

5. A method according to claim 4, further comprising:
    fabricating a conductive element disposed over the body region and the second body region, the conductive element oriented in the direction.

6. A method according to claim 5, the conductive element to prevent fabrication of a halo implant in the memory cell.

* * * * *